US006382951B1

(12) United States Patent
Söderberg et al.

(10) Patent No.: US 6,382,951 B1
(45) **Date of Patent: *May 7, 2002**

(54) $AL_2O_3$ COATED CUTTING TOOL

(75) Inventors: Staffan Söderberg; Peter Littecke, both of Huddinge (SE)

(73) Assignee: Sandvik AB, Sandviken (SE)

( * ) Notice: Subject to any disclaimer, the term of this patent is extended or adjusted under 35 U.S.C. 154(b) by 0 days.

This patent is subject to a terminal disclaimer.

(21) Appl. No.: 09/572,309

(22) Filed: May 18, 2000

(30) Foreign Application Priority Data

May 19, 1999 (SE) ............................................ 9901823

(51) Int. Cl.[7] ............................................ C23C 16/40

(52) U.S. Cl. .......................... 425/325; 51/307; 51/309; 428/336; 428/698; 428/472; 428/701; 428/702

(58) Field of Search ................................ 428/325, 398, 428/701, 702, 336, 472; 51/307, 309

(56) References Cited

U.S. PATENT DOCUMENTS 5,503,913 A 4/1996 König et al. ................ 428/216
5,516,588 A 5/1996 van den Berg et al.
5,674,564 A 10/1997 Ljungberg et al.
5,693,417 A * 12/1997 Goedicke et al. ........... 428/336
5,700,551 A * 12/1997 Kukino et al. .............. 428/698
5,879,823 A 3/1999 Prizzi et al.
6,090,476 A * 7/2000 Thysell et al. .............. 428/216
6,210,726 B1 * 4/2001 Schiller et al. ............. 428/216

FOREIGN PATENT DOCUMENTS

EP 0 744 473 A1 11/1996
WO WO 98/28464 7/1998
WO WO 99/27155 6/1999

OTHER PUBLICATIONS

O. Zywitzki et al., "Effect of the substrate temperature on the structure and properties of $A1_2O_3$ layers reactively deposited by pulsed magnetron sputtering," *Surface and Coatings Technology*, 82 (1996), pp. 169–175.

"Deposition of hard crystalline $Al_2O_3$ coatings by bipolar pulsed d.c. PACVD," Ch. Täschner et al.; Elsevier 1998.

* cited by examiner

*Primary Examiner*—Archene Turner
(74) *Attorney, Agent, or Firm*—Burns, Doane, Swecker & Mathis, L.L.P.

(57) ABSTRACT

The present invention describes a coated CBN cutting tool for metal machining. The tool is composed of one or more CBN bodies with or without a cemented carbide backing. The coating comprises one or more layers of refractory compounds of which at least one layer consists of fine-grained, crystalline γ-phase alumina, $Al_2O_3$, with a grain give less than 0.1 $\mu$m. The γ-phase alumina is deposited with a Plasma Activated Chemical Vapor Deposition (PACVD) process in which the plasma is produced by applying a bipolar pulsed DC voltage across two electrodes to which the tool substrates to be coated are fixtured and electrically connected.

17 Claims, 1 Drawing Sheet

Figure 1:
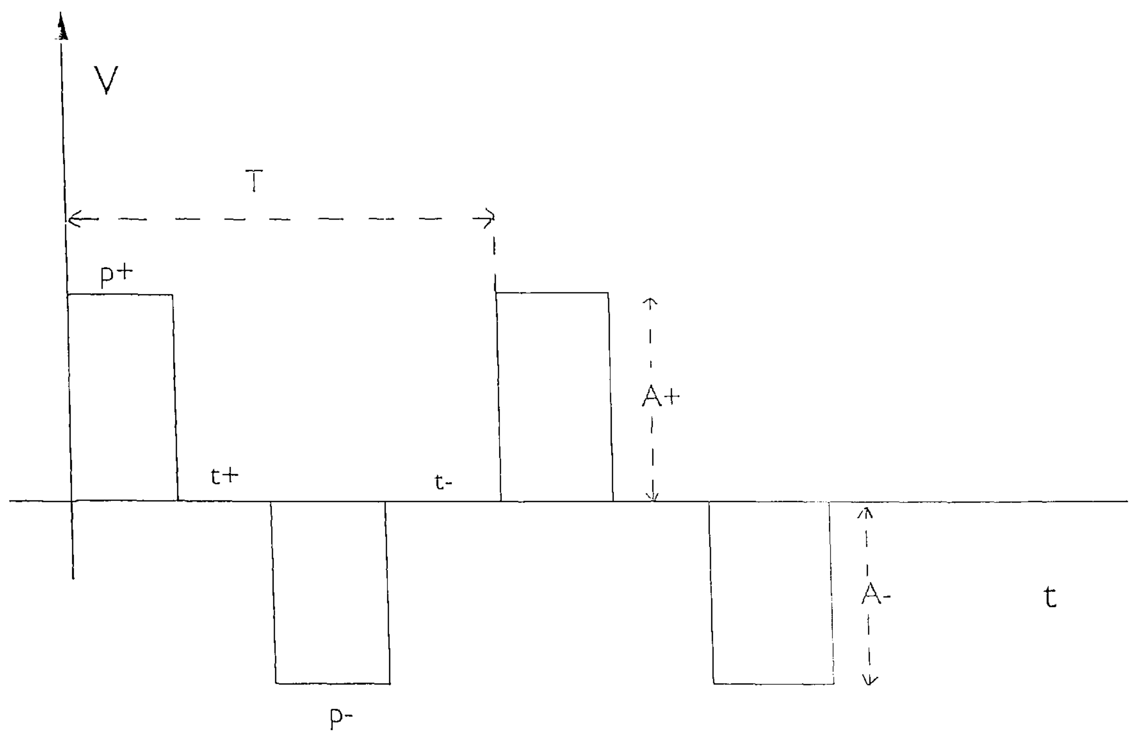

V
T
p+
t+
t-
A+
A-
t
p-

$AL_2O_3$ COATED CUTTING TOOL

FIELD OF THE INVENTION

The present invention relates to a cutting tool for metal machining, comprising at least one body containing PCBN, (polycrystalline cubic boron nitride), with or without cemented carbide backing, and a hard and wear resistant refractory coating on the surface of said body. The coating is adherently bonded to the body and covers all functional parts thereof. The coating is composed of one or more layers of refractory compounds of which at least one layer consists of fine-crystalline $\gamma$-$Al_2O_3$, deposited by Plasma Activated CVD-methods (PACVD).

BACKGROUND OF THE INVENTION

Cutting tools having cutting edges formed of a superhard abrasive such as a cubic boron nitride (CBN) based material are manufactured by powder metallurgical techniques and are mainly used for the machining of cast iron and hardened steel. Several types of CBN cutting tools are known, the majority of which consisting of a CBN tip that has been brazed onto a cemented carbide insert. Others have the CBN sintered directly to a cemented carbide backing of sufficient thickness to produce an insert while yet others consist of solid CBN-containing body without any cemented carbide backing.

Subjecting a sintered CBN body to temperatures over 1,000° C. may result in undesirable structural changes in the material. Furthermore, in the case of a brazed insert the braze joint will be destroyed.

Swedish patent application 9704387-1 discloses a method for depositing refractory alumina ($Al_2O_3$) thin layers on cutting tools made of cemented carbide, cermet, ceramics or high speed steel. The invented method is a Plasma Activated Chemical Vapor Deposition (PACVD) process in which the plasma is produced by applying a bipolar pulsed DC voltage across two electrodes to which the tool substrates to be coated are fixtured and electrically connected.

WO 98/28464 discloses that by applying a coating including a MTCVD-TiCN and a CVD-$Al_2O_3$ layer to such a CBN tool material, substantial advantages in tool life can be achieved when machining hardened ball bearing steel.

U.S. Pat. No. 5,503,913 discloses improving the wear properties of tools with a cutting edge of cubic boron nitride or polycrystalline cubic boron nitride to coat the superhard body with a 0.5–6 $\mu$m thick coating of one or more oxides of the metals Zr, Y, Mg, Ti or Al. The coating is deposited from the gas phase at temperatures up to 800° C., preferably using a pulse plasma CVD-process.

SUMMARY OF THE PRESENT INVENTION

According to the present invention, the disadvantages associated with the prior art are overcome.

According to one aspect of the present invention there is provided a cutting tool comprising a substrate and a coating; said substrate comprising a body containing at least 35 vol-% cubic boron nitride; and said coating comprising at least one layer of alumina, said alumina layer consisting essentially of $\gamma$-$Al_2O_3$ with a grain size between 5 and 200 nm.

According to a further aspect, the present invention provides a method of making a cutting tool comprising a substrate and a coating by a plasma activated chemical vapor deposition technique, wherein the technique comprises: pulsing a DC voltage between two electrodes to which substrate bodies to be coated are fixtured and electrically connected, such that the electrodes alternately act as an anode and a cathode; providing an atmosphere comprising $AlCl_3$, $H_2$ and Ar together with at least one oxygen donor chosen from $O_2$, $CO_2$, CO, and $N_2O$; providing a pulse frequency of 5–100kHz; providing a pulse amplitude of 300–1000 volts, and providing a substrate temperature of 500–900° C.

BRIEF DESCRIPTION OF THE DRAWING FIGURE

FIG. 1 illustrates various processing parameters of a PACVD deposition technique according to the present invention.

DETAILED DESCRIPTION OF PREFERRED EMBODIMENTS

According to the present invention a cutting tool comprising at least one body containing at least 35 vol-% cubic boron nitride, CBN, is provided with a hard and wear resistant refractory coating. The hard and wear resistant coating is composed of one or more layers of refractory compounds of which at least one layer consists of fine crystalline $\gamma$-$Al_2O_3$ deposited thereon by the PACVD methods at substrate temperatures of 500 to 800° C.

The $\gamma$-$Al_2O_3$ layer consists of high-quality, dense, fine-grained crystalline $Al_2O_3$. The layer is transparent and has a very smooth surface finish. It is further characterized by a high hardness larger than or equal to 19 GPa and a grain size estimated between 5 and 200 nm. Furthermore, the $\gamma$-$Al_2O_3$-layer is virtually free of cracks. The inner layer(s), if any at all, between the tool body and the $Al_2O_3$-layer, is (are) composed of metal nitrides and/or carbides with the metal elements selected from Ti, Nb, Hf, V, Ta, Mo, Zr, Cr, W and Al.

In a first embodiment the PCBN material according to the invention contains more than 70 vol-% CBN with 5–10 wt % AlN and a metallic binder phase, generally Co, originating from the cemented carbide backing of the tool. This material is particularly useful for the machining of cast iron.

In a second embodiment the PCBN-material contains less than 70 vol-% CBN the remainder being other hard wear resistant constituents such as carbides, nitrides, carbonitrides, oxides or borides of the metals of groups IVA to VIA of the periodic table, usually TiC, TiN or Ti(C,N). An example of such a material is disclosed in U.S. Pat. No. 5,639,285. This kind of PCBN-material is mainly used in cutting tools for machining of hardened steel.

Often, the PCBN material also contains smaller amounts (typically <10 wt % each) of other components, e.g. Co, Ni, WC, Al, AlN and $Al_2O_3$.

In a third embodiment PCBN cutting tool is manufactured without a cemented carbide backing or support. Usually such a product contains more than 80% CBN by volume the remaining portion being a metallic binder phase, generally Co.

In a fourth embodiment the PCBN cutting tool contains a CBN-containing material attached to a substrate, preferably a cemented carbide substrate, by brazing, sintering or in any other way. The cemented carbide can comprise WC-Co with 10–20, preferably 15–17, wt-% Co.

The $\gamma$-$Al_2O_3$-layers according to the invention further give the cutting edges of the tool an extremely smooth surface finish which also results in an improved surface finish of the work piece being machined. The very smooth surface finish can be attributed to the very fine crystallinity of the coating. The "$\gamma$-$Al_2O_3$"-layers may also partially contain other phases from the "$\gamma$-series" like $\theta$, $\delta$ and $\eta$. Identification of the $\gamma$- and/or $\theta$-phases in the $Al_2O_3$-layers according to the invention can preferably be made by X-ray diffraction. Reflexes from the (400) and (440) planes of the $\gamma$-$Al_2O_3$-layers occurring at the 2$\theta$-angles 45.80 and 66.80 when using $Cu_{K\alpha}$ radiation, unequivocally identifies the $\gamma$-phase. Weaker reflexes from the (222), (200) and (311) planes of the $\gamma$-phase can occasionally be identified. When the $\theta$-phase is present in the $Al_2O_3$-layers according to the invention, said phase is identified by the reflexes from the (200, 20-2) planes.

The fine-grained, crystalline $\gamma$-$Al_2O_3$ according to the invention is strongly textured in the [440]-direction. A Texture Coefficient, TC, can be defined as:

$$TC(hkl) = \frac{I(hkl)}{I_o(hkl)}\left\{\frac{1}{n}\sum\frac{I(hkl)}{I_O(hkl)}\right\}^{-1}$$

where

I(hkl)=measured intensity of the (hkl) reflection $I_o$ (hkl)=standard intensity from the ASTM standard powder pattern diffraction data n=number of reflections used in the calculation (hkl) reflections used are: (111), (311), (222), (400) and (440) and whenever the TC (hkl)>1, there is a texture in the [hkl]-direction. The larger the value of TC(hkl), the more pronounced is the texture. According to the present invention, the TC for the set of (440) crystal planes is greater than 1.5.

A further improvement in cutting performance can be anticipated if the edges of the $\gamma$-$Al_2O_3$ coated cutting tools according to the invention are treated by a gentle wet—blasting process or by edge brushing with brushes based on, for example, SiC as disclosed in U.S. Pat. No. 5,861,210.

The total coating thickness according to the present invention varies between 0.5 and 20 $\mu$m, preferably between 1 and 15 $\mu$m with the thickness of the non-$Al_2O_3$-layer(s) varying between 0.1 and 10 $\mu$m, preferably between 0.5 and 5 $\mu$m.

The fine-grained $\gamma$-$Al_2O_3$-coating can also be deposited directly onto the CBN cutting tool and the thickness of said $\gamma$-$Al_2O_3$ varies then between 0.5 and 15 $\mu$m preferably between 1 and 10 $\mu$m. Likewise further coatings of metal nitrides and/or carbides with the metal elements selected from Ti, Nb, Hf, V, Ta, Mo, Zr, Cr, W and Al can be deposited on top of the $Al_2O_3$-layer, preferably TiN.

The method of the present invention is based on a plasma activation of a reaction mixture of the chemical reactants $AlCl_3$, $H_2$ and Ar together with an oxygen-donor $O_2$, $CO_2$, CO and $N_2O$. Preferably the oxygen-donor is $O_2$. Applying a bipolar pulsed DC voltage across two electrodes produces the plasma or two sets of electrodes to which the substrate bodies to be coated are fixtured and electrically connected. Alternatively, the reactor wall may serve as an electrode. The two electrodes or the two sets of electrodes alternately act as anode(s) and cathode(s). The alternation of the voltage pulse applied to the electrodes between positive and negative potential has several advantages. Firstly, the undesirable built-up electrical charge on nonconducting surfaces during the negative pulse period will be discharged during the positive pulse period and, by selecting a high enough frequency, e.g.- >5 kHz, of the bipolar pulsed DC voltage, arcing can be eliminated. This will permit stable, long term processing. Secondly, if no pause time between the positive and the negative pulses is allowed for, the plasma will constantly be activated resulting in a higher deposition rate compared to prior art unipolar pulsed DC voltage techniques.

A further advantage of the present invention is that the growth rate is practically constant on all surfaces alike, edges, corners and flat surfaces of the body subjected to coating.

The method, bipolar pulsed DC voltage PACVD, can also successfully be used for the deposition of non-insulating coatings such as TiC, TiN, TiCN and TiAlN, or other carbides and/or nitrides with the metal element chosen from Nb, Hf, V, Ta, Mo, Zr, Cr and W.

In order to attain optimum coating quality and growth rate when applying the bipolar pulsed DC voltage technique, the frequency, pulse amplitudes, positive and negative pulse on/off times can be varied, which is illustrated in FIG. 1. A frequency in the range 5–100 kHz can be used, preferably 8–20 kHz. The pulse amplitudes can vary between 300 and 1000 Volts, preferably between 600 and 900 Volts, and the negative and positive pulse on times as well as the negative and positive pulse off times (zero potential) within the period T of the pulsed DC voltage can also be varied in order to modify the coating properties and the stability of the process. Following the definitions of the parameters $P_+$, $P_-$, $t_+$, $t_-$, $A_+$ and $A_-$ below:

Pulse on time positive=$P_+$

Pulse off time positive=$t_+$

Positive pulse amplitude=$A_+$

Pulse on time negative=$P_-$

Pulse off time negative=$t_-$

Negative pulse amplitude=$A_-$ where $P_- \geqq P_+ \geqq 0.1P_-$, preferably $0.5P_- \geqq P_+ \geqq 0.1P_-$, and where also $P_- \geqq 0.1T$. The negative and positive pulse off times should be set to larger or equal to zero i.e. $t_- \geqq 0$ and $t_+$24 0. The amplitude $A_+$ is essentially of equal magnitude as amplitude $A_-$.

The following gas composition, process pressure and substrate temperature may be used:

| | Possible range | Preferred-range |
|---|---|---|
| $AlCl_3$ | 0.1–2% | 0.2–0.4% |
| $O_2$ | 0.1–3.9% | 0.1–2.0% |
| $H_2$ | 25–95% | 70–80% |
| Ar | 5–75% | 20–30% |
| $O_2/AlCl_3$-ratio | ≧1.5 | 1.5–2.5 |
| Process pressure: | 0.05–1 kPa | 0.1–0.4 kPa |
| Substrate temperature: | 500–800° C. | 600–700° C. |

The principles, preferred embodiments and mode of operation of the present invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit of the invention.

We claim:

1. A cutting tool comprising a substrate and a coating said substrate comprising a body containing at least 35 vol- % cubic boron nitride; and said coating comprising at least one layer of alumina, said alumina layer consisting essentially of $\gamma$-$Al_2O_3$ with a grain size between 5 and 200 nm.

2. The cutting tool of claim 1, wherein the $Al_2O_3$-layer exhibits significant X-ray diffraction reflexes from at least one of the (440) and (400) crystal planes, said at least one layer having a hardness of at least 19 GPa.

3. The cutting tool of claim 1, wherein the $Al_2O_3$-layer has a preferred growth orientation in the [440]-direction with a texture coefficient greater than 1.5 defined as:

$$TC(hkl) = \frac{I(hkl)}{I_o(hkl)}\left\{\frac{1}{n}\sum\frac{I(hkl)}{I_O(hkl)}\right\}^{-1}$$

where

I(hkl)=measured intensity of the (hkl) reflection $I_O$(hkl)=standard intensity from the ASTM standard powder pattern diffraction data n=number of reflections used in the calculation (hkl) reflections used are: (111), (311), (222), (400) and (440).

4. The cutting tool of claim 1, wherein the fine grained crystalline γ-$Al_2O_3$-layer contains portions of additional alumina phases from the γ-series of the $Al_2O_3$- polymorphs.

5. The method of claim 4, wherein the $Al_2O_3$ polymorphs comprise θ phase.

6. The cutting tool of claim 1, wherein the coating further comprises at least one layer of thickness 0.1–10 μm, comprising metal nitrides and/or carbides with the metal element selected from Ti, Nb, Hf, V, Ta, Mo, Zr, Cr, W and Al.

7. The cutting tool of claim 6, wherein the metal nitrides and/or carbides comprise at least one of TiC, TiCN, TiN, and TiAlN.

8. The cutting tool of claim 1, wherein the outer layer is $Al_2O_3$.

9. The cutting tool of claim 1, wherein the outer layer is TiN.

10. The cutting tool of claim 1, wherein the substrate contains more than 80% CBN by volume.

11. The cutting tool of claim 1, wherein the substrate contains less than 70% CBN by volume, the remainder being other hard wear resistant constituents chosen from carbides, nitrides, carbonitrides, oxides or borides of the metals of groups IVA to VIA of the periodic table.

12. The cutting tool of claim 11, wherein the other hard wear resistant constituents comprise, TiC, TiN or Ti(C,N).

13. The cutting tool of claim 11, wherein the substrate comprises cemented carbide and the body comprising the CBN material is attached to the substrate by brazing or sintering.

14. The cutting tool of claim 13, wherein the cemented carbide is WC-Co with 10–20 wt-% Co.

15. The cutting tool of claim 14, wherein the cemented carbide comprises 15–17 wt. % Co.

16. The cutting tool of claim 1, wherein said tool is formed entirely of the CBN-containing material.

17. The cutting tool of claim 1, wherein said tool is formed from the CBN-containing material attached to a substrate.

* * * * *